(12) United States Patent
Aube et al.

(10) Patent No.: US 7,259,580 B2
(45) Date of Patent: Aug. 21, 2007

(54) METHOD AND APPARATUS FOR TEMPORARY THERMAL COUPLING OF AN ELECTRONIC DEVICE TO A HEAT SINK DURING TEST

(75) Inventors: Paul J. Aube, Charlotte, VT (US); Normand Cote, Granby (CA); Roger G. Gamache, Jr., Essex Junction, VT (US); David L. Gardell, Fairfax, VT (US); Paul M. Gaschke, Wappingers Falls, NY (US); Marc D. Knox, Hinesburg, VT (US); Denis Turcotte, Granby (CA)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/906,483

(22) Filed: Feb. 22, 2005

(65) Prior Publication Data

US 2006/0186909 A1    Aug. 24, 2006

(51) Int. Cl.
   *G01R 31/26* (2006.01)
(52) U.S. Cl. .................. 324/765; 324/158.1
(58) Field of Classification Search ................ None
   See application file for complete search history.

(56) References Cited

U.S. PATENT DOCUMENTS

| | | | | |
|---|---|---|---|---|
| 3,920,572 A * | 11/1975 | King et al. | | 252/75 |
| 3,958,624 A * | 5/1976 | Peeler et al. | | 252/75 |
| 4,239,638 A * | 12/1980 | Beretta et al. | | 252/73 |
| 4,323,533 A * | 4/1982 | Bramhall | | 264/145 |
| 4,507,274 A * | 3/1985 | Broecker et al. | | 423/574.1 |
| 4,548,857 A * | 10/1985 | Galante | | 428/200 |
| 4,567,505 A | 1/1986 | Pease et al. | | |
| 5,053,434 A * | 10/1991 | Chapman | | 521/52 |
| 5,170,930 A | 12/1992 | Dolbear et al. | | |
| 5,864,176 A | 1/1999 | Babock et al. | | |
| 5,895,972 A * | 4/1999 | Paniccia | | 257/706 |
| 5,918,665 A | 7/1999 | Babock et al. | | |
| 6,576,996 B2 * | 6/2003 | Egitto et al. | | 257/706 |
| 6,621,275 B2 * | 9/2003 | Cotton et al. | | 324/537 |
| 6,624,224 B1 | 9/2003 | Misra | | |
| 6,788,538 B1 * | 9/2004 | Gibbs et al. | | 361/704 |
| 6,836,131 B2 * | 12/2004 | Cader et al. | | 324/760 |
| 7,038,065 B2 * | 5/2006 | Franz et al. | | 549/307 |
| 2002/0111415 A1 * | 8/2002 | Mack et al. | | 524/496 |
| 2003/0203188 A1 | 10/2003 | Bunyan | | |

OTHER PUBLICATIONS

"Hign Conduction Thermal Interface Material" by IBM Technical Disclosure Bulletin, Oct. 1993, US pp. 581-583 (three pages).*

* cited by examiner

*Primary Examiner*—Paresh Patel
(74) *Attorney, Agent, or Firm*—Schmeiser, Olsen & Watts; Anthony J. Canale

(57) ABSTRACT

A method, system and apparatus for testing an electronic device. The method including: (a) forming a temporary liquid heat transfer layer on a surface of the electronic device; after step (a), (b) placing a surface of a heat sink into physical contact with a surface of the heat transfer layer; after step (b), (c) electrically testing the electronic device; after step (c), (d) removing the heat sink from contact with the heat transfer layer; and after step (d), (e) removing any heat transfer layer remaining on the electronic device from the surface of the electronic device.

17 Claims, 7 Drawing Sheets

METHOD AND APPARATUS FOR TEMPORARY THERMAL COUPLING OF AN ELECTRONIC DEVICE TO A HEAT SINK DURING TEST

FIELD OF THE INVENTION

The present invention relates to the field of integrated circuit chip testing; more specifically, it relates to a method and an apparatus for temporary thermal coupling of an integrated circuit chip to a heat sink during testing of the integrated circuit.

BACKGROUND OF THE INVENTION

As the transistor density and size of high performance integrated circuits, such as micro-processors increases, power usage and attendant heat generation increase as well. This becomes a significant problem during test of the integrated circuit chip, as the integrated circuit must be cooled to avoid thermally induced test result errors or even integrated circuit chip failures. Testing is often performed with the integrated circuit chip temporarily mounted on a test substrate. Increasingly, conventional cooling employed during test is insufficient to maintain the integrated circuit chip at a precise temperature. Therefore, there is a need for an efficient method and apparatus for thermally coupling an integrated circuit chip under test to a heat sink.

SUMMARY OF THE INVENTION

A first aspect of the present invention is a method of testing an electronic device, comprising: (a) forming a liquid heat transfer layer on a surface of the electronic device; after step (a), (b) placing a surface of a heat sink into physical contact with a surface of the heat transfer layer; after step (b), (c) electrically testing the electronic device; after step (c), (d) removing the heat sink from contact with the heat transfer layer; and after step (d), (e) removing any heat transfer layer remaining on the electronic device from the surface of the electronic device.

A second aspect of the present invention is a system for testing an integrated circuit, comprising: means for forming a liquid heat transfer layer on a bottom surface of the integrated circuit, a top surface of the integrated circuit chip having signal and power pads and the bottom surface of the integrated circuit having no signal or power pads; means for placing a surface of a heat sink into physical contact with the bottom surface of the heat transfer layer; means for electrically coupling the integrated circuit to a tester, electrically testing the integrated circuit and electrically de-coupling the integrated circuit from the tester; means for removing the heat sink from contact with the heat transfer layer, all or a portion of the heat transfer layer remaining on the bottom surface of the integrated circuit; and means for removing the heat transfer layer from the bottom surface of the integrated circuit.

A third aspect of the present invention is an apparatus for testing integrated circuit chips at a test temperature, comprising: means for loading and unloading substrates from and to substrate carriers, the integrated circuit chips electronically connected to the substrates; means for applying a layer of a heat transfer material to a bottom surface of the integrated circuit, a top surface of the integrated circuit chip electrically connected to the substrate; means for loading and unloading the substrates from and to burn-in boards and for loading and unloading burn-in boards loaded with substrates from and to one or more test racks; means for removing the heat transfer material from the back surface of integrated circuit chips; means for moving the substrates between the means for loading and unloading substrates from and to the substrate carriers, the means for applying the layer of the heat transfer material to the bottom surface of the integrated circuit, means for loading and unloading the substrates from and to the burn-in boards and the means for removing the heat transfer material from the back surface of integrated circuit chips; means for supplying cooling fluid to heats sinks mounted on the test rack; means for bringing surfaces of the heat sinks into physical contact with the heat transfer material; and means for testing electrical function of the integrated circuit chip.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Integrated circuit chips need to be tested not only for yield but also for reliability. Yield testing and reliability testing differ in two ways. First yield testing is often, but not exclusively, performed on individual integrated circuit chips while reliability testing is often, but not exclusively, performed on multiple integrated circuit chips at the same time. Second, yield testing time is measured in seconds or minutes while reliability testing generally takes hours or days. While both types of testing may be performed at room temperature (i.e. about 24° C.) or at elevated temperatures (i.e. above room temperature), for yield testing elevated temperature testing is used to assure compliance to integrated circuit chip temperature specifications while for reliability testing, elevated temperature testing is used to accelerate potential failure rates. Both types of testing can generate large amounts of heat that need to be dissipated. In both types of testing the integrated circuit chip temperature needs to be precisely controlled in order to ensure accurate test results. In one example, burn-in testing is performed with the integrated circuit chip at a temperature of about 80° C. or greater. In a second example, the burn-in testing is performed with the integrated circuit chip at a temperature of about 140° C. or greater.

Since reliability testing, and a particular type of reliability testing called burn-in generally presents the more severe temperature and heat dissipation problems, the present invention will be described in terms of burn-in testing with the individual integrated circuit chips mounted on substrates. However, the present invention is applicable to all types of integrated circuit chip testing where thermal cooling of the integrated circuit chip is required.

Reliability stressing and testing (also referred to as Burn-In) is typically performed on a wide variety of integrated circuit chip package and carrier types. The package and/or carrier type are typically dependent on the manufacturing process flow or the end use requirements. Since worst-case chip powers are often experienced on high-end microprocessors, a typical high power server class microprocessor package will be used to illustrate the present invention. While this is a single example, the present invention is applicable to various other multiple package types such as, lidded packages, encapsulated packages, few chip module packages and multi chip module packages. The present invention is also applicable to various types and constructions of integrated circuit chip carriers or substrates.

Figure 1:
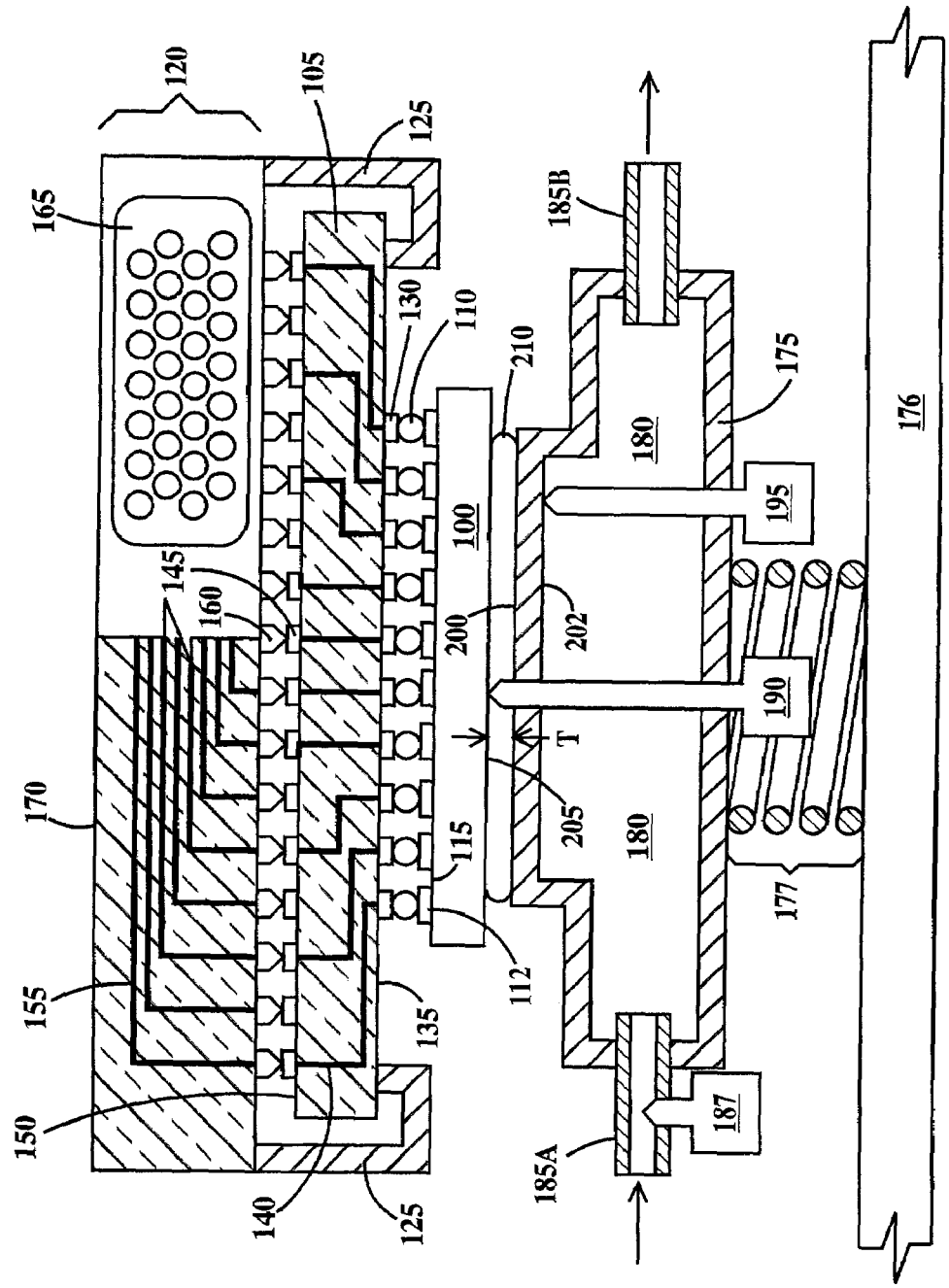
FIG. 1 is a cross-sectional view of a test fixture for practicing the present invention.
Figure 2:
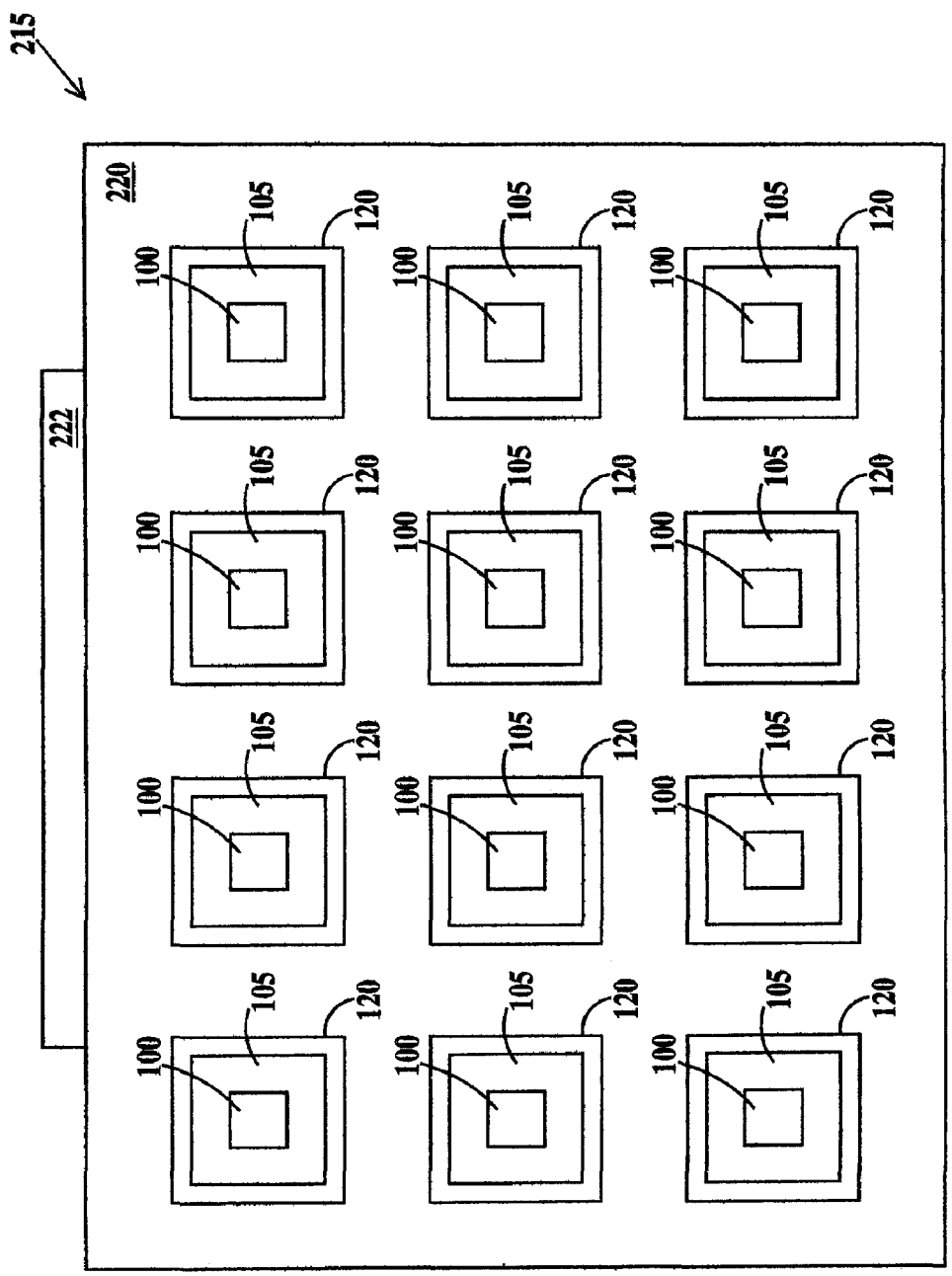
FIG. 2 is a schematic top view of a burn-in board 215 for practicing the present invention.

FIG. 1 is a cross-sectional view of a test fixture for practicing the present invention. In FIG. 1, an integrated circuit chip 100 is either temporarily or permanently mounted and electrically connected to a substrate 105 by a multiplicity of solder balls 110 on signal and power pads 112 on a top surface 115 of the integrated circuit chip. This type of connection is also called a controlled collapse chip connection (C4) or a flip-chip connection. Substrate 105 may be a temporary substrate or a permanent substrate. Substrate 105 is inserted into a socket 120 and secured in the socket by clips 125. Circuits (not shown) in integrated circuit chip 100 are electrically connected to pads 112 and then through solder balls 110 to frontside pads 130 on a top surface 135 of substrate 105. Wires 140 within substrate 105 are electrically connected to backside pads 145 on a bottom surface 150 of substrate 105. Backside pads 145 are electrically connected to wires 155 within socket 120 by contacts 160. Wires 155 are electrically connected to a multi-wire plug 165. Multi-wire plug 165 may be connected to a tester for supplying power and signals or to burn-in board as illustrated in FIG. 2 and described infra. Alternatively, wires 155 could be electrically connected to pins extending from a bottom surface 170 of socket 120 and the pins plugged into a cable connected to the testers or the pins soldered to vias a burn in board which in turn is connected to the tester or burn-in board or surface mounted (soldered) to pads on the surface of the burn in board.

Also illustrated in FIG. 1, is a heat sink 175. Heat sink 175 is permanently mounted on a heat sink fixture array plate 176 in a burn-in chamber (see FIG. 3 and description infra) by way of a spring 177. Heat sink 175 includes a cavity 180. A cooling fluid may be circulated from an inlet 185A, through cavity 180 and out an outlet 185B in order to cool heat sink 175. To control the temperature of integrated circuit chip 100, a first, second and third temperature sensors 187, 190 and 195 are provided. First temperature sensor 187 measures the temperature of the cooling fluid entering heat sink 175. Second temperature sensor 190, extending past a top surface 200 of the heat sink and contacting a bottom surface 205 of integrated circuit chip 100 measures the temperature of integrated circuit chip 100. Third temperature sensor 195 contacting an upper inside surface 202 of heat sink 175 measures the temperature of the heat sink itself.

A mechanism (not shown) in the burn-in chamber presses heat sink fixture array plate 176 toward integrated circuit chip 100. A heat transfer layer 210 (previously applied to bottom surface 205 of integrated circuit chip 100) of thermally conductive and electrically non-conductive material is thus forced into intimate contact with top surface 200 of heat sink 175 and bottom surface 205 of integrated circuit chip 100. Heat transfer layer 210 provides a temporary thermal coupling of integrated circuit 100 to heat sink 175. The composition and properties of heat transfer layer 210 are described infra.

Spring 177 assures heat sink 175 will be in intimate contact with some areas of the integrated circuit chip 205. The exact points of contact and the thickness T of the heat transfer layer 210 will be defined by the flatness of both integrated circuit chip 100 and top surface 200 of heat sink 175. In one example, top surface 200 of heat sink 175 is machined to a flatness of less than about 1 micron and the flatness integrated circuit chip 100 is about 3 microns or less depending on the residual stress within integrated circuit chip 100 from the manufacturing process. The thickness T of heat transfer layer 210, thus ranges from about zero to about 3 microns.

Second temperature sensor 190 may also be spring loaded in order to prevent damage to integrated circuit chip 100, but still maintain physical contact with bottom surface 205 of the integrated circuit chip. Both second and third temperature sensors 190 and 195 may be used to control the temperature and flow rate of the cooling fluid circulated through cavity 180.

In an alternative embodiment, second temperature sensor 190, is replaced with a temperature sensor "built into" integrated circuit chip 100. Various types of on-chip temperature sensors are known to those skilled in the art.

In some applications, powering and operation of the integrated circuit generates the heat to be dissipated by the hneat sinks. In other cases heat must be supplied by the burn-in chamber (acting as an oven) or by a heater (not shown) directly attached to heat sink 175 or by using a heating fluid instead of a cooling fluid. In either case, the heat sink maintains integrated circuit chip 100 at a precise test temperature.

FIG. 2 is a schematic top view of a burn-in board 215 for practicing the present invention. In FIG. 2, a burn-in board 215 includes a high temperature circuit board 220 and a multi-wire connector 222 for plugging the burn-in board into a corresponding connector in the burn-in chamber (see FIG. 3) of a test system for supplying power and test signals to be distributed to individual sockets 120 by wires (not shown) within the burn-in board. A multiplicity of sockets 120 are permanently mounted on circuit board 215. Each socket 120 is illustrated containing a substrate 105 and an integrated circuit chip 100.

Figure 3:
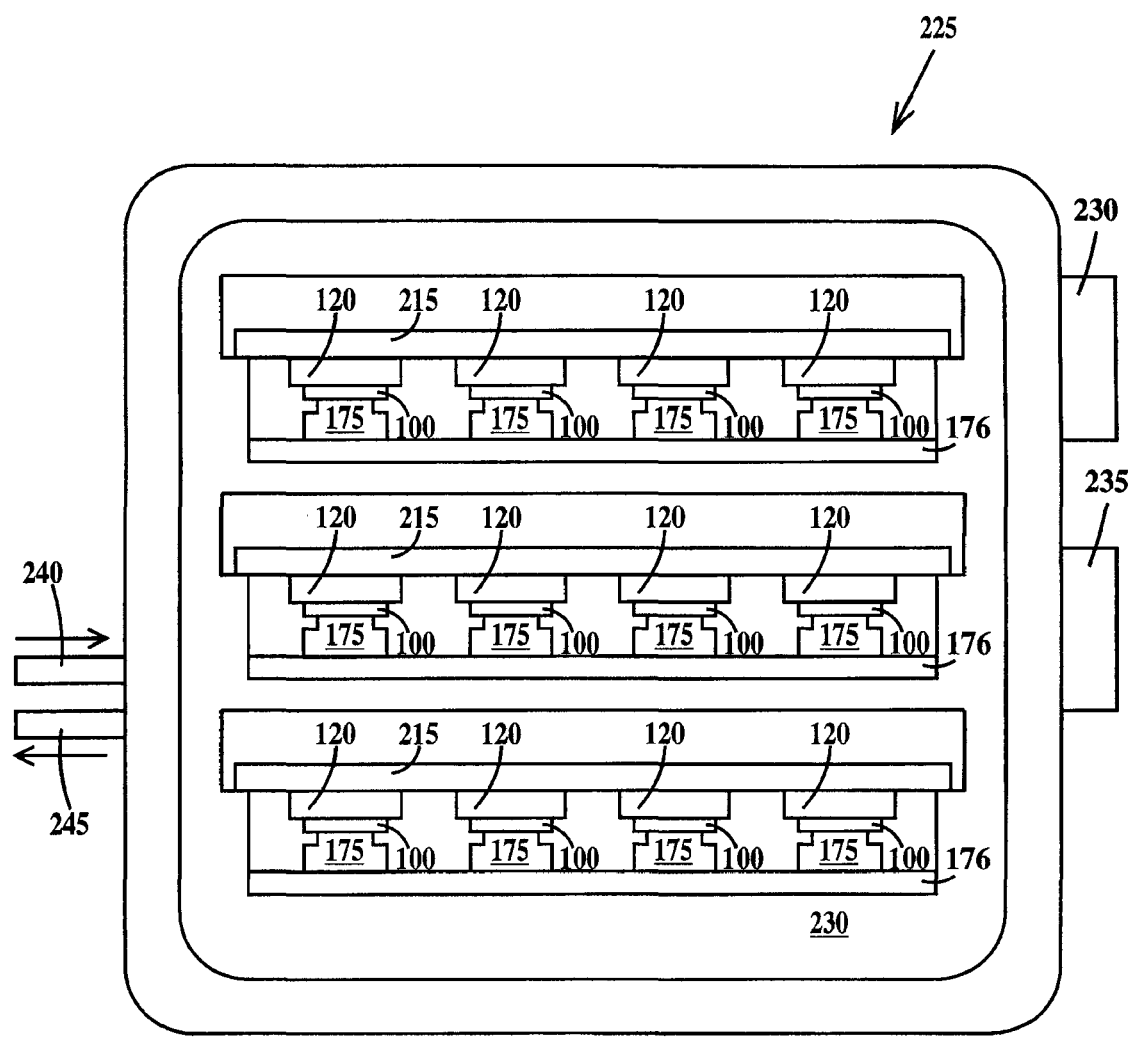
FIG. 3 is a schematic front view of a burn-in chamber 225 for practicing the present invention.

FIG. 3 is a schematic front view of a burn-in chamber 225 for practicing the present invention. In FIG. 3, a burn-in chamber 225 includes multiple heat sink fixture array plates 176, a multiplicity of heat sinks 175 and a rack 230. Multiple burn in boards 215, each having multiple sockets holding integrated circuit chips 100, are removably mounted in rack 230. Burn-in chamber 225 includes a power cable connector 230 and a test cable connector 235 for supplying power and test signals from a tester (not shown) to connectors (not shown) in rack 230 into which burn-in boards 225 are plugged. Burn-in chamber 225 also includes a cooling fluid inlet 240 and a cooling fluid outlet 245 for supplying cooling fluid from a cooling unit (not shown) to each heat sink 175. Heat-sinks 175 are permanently but moveably mounted to a heat sink fixture array plate 176 which is movably mounted to rack 230.

In a first alternate embodiment, each heat sink 175 is attached to the lid of a corresponding burn in socket 120 (see FIG. 2) and closing the socket lid brings the heat sink in intimate contact with integrated circuit chip 100. In a second alternate embodiment, heat sink fixture arrays 176 and burn-in boards 215 can be mounted in alternate orientations. For example, burn-in boards 215 and heat sink array plates 176 may be positioned vertically instead of horizontally (as illustrated in FIG. 3) or heat sink array plates 176 may be position on top of burn-in board 215 instead of the burin-in boards being positioned on top of the heat sink array plates.

As will be described infra, heat transfer layer 210 (see FIG. 1) is applied to integrated circuit chips 100 before they are mounted in burn-in boards 215 and removed after testing is complete. It is advantageous to apply the heat transfer material in a manner that results in a small volume of heat transfer material but results in no voids over the course of the burn in test in order to reduce costs.

Figure 4A:
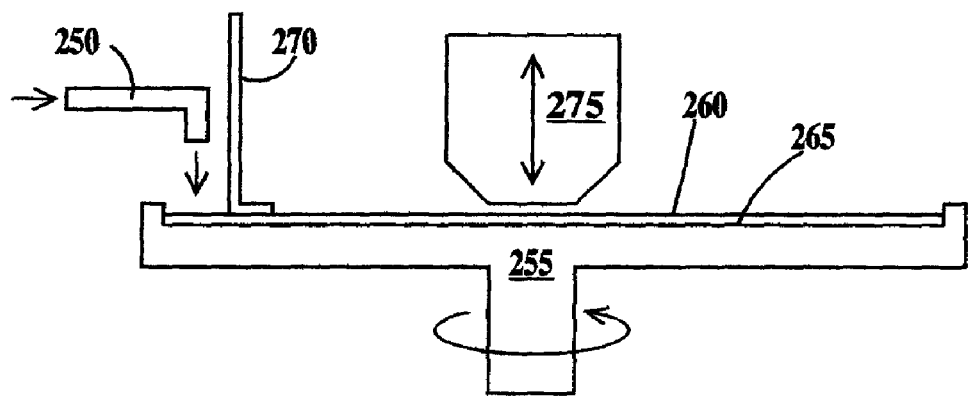
FIGS. 4A-4E illustrate a first method and apparatus for applying a heat transfer material to an integrated circuit chip to be tested according to the present invention.
Figure 4B:
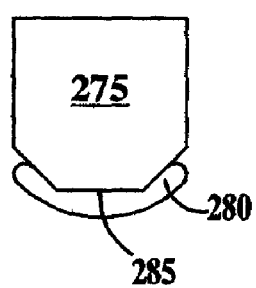

FIGS. 4A-4D illustrate a first method and apparatus for applying a heat transfer material to an integrated circuit chip to be tested according to the present invention. In FIG. 4A, a dispensing nozzle 250 applies a heat transfer liquid onto a slowly rotating platen 255 to form a layer 260 of heat transfer liquid on a top surface 265 of platen 255. A weir 270, adjustable in a direction perpendicular to top surface 265 of platen 255 allows for control of the thickness of layer 260. A resilient stamp 275 free to travel in a direction perpendicular to top surface 265 of platen 255 is dipped into layer 260 and then removed and is thus wetted with heat transfer liquid as shown in FIG. 4B.

Figure 4C:
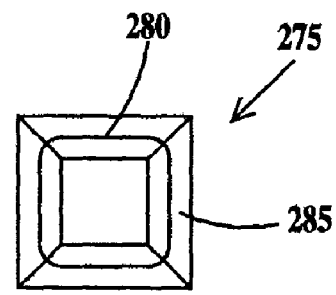
Figure 4D:
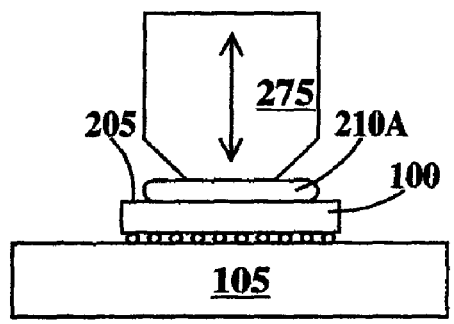
Figure 4E:
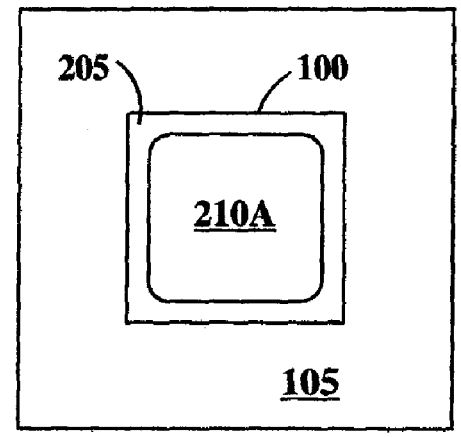

In FIG. 4B, a layer 280 of heat transfer liquid is formed on a bottom surface 285 of stamp 275. FIG. 4C is a view of bottom surface 285 of stamp 275 showing surface 285 has the shape of a truncated pyramid. Layer 280 is also illustrated. In FIG. 4D, stamp 275 is pressed to and then released from bottom surface 205 of integrated circuit chip 100 thus transferring all or a portion of layer 280 (see FIG. 4B) to integrated circuit chip and forming a heat transfer layer 210A on bottom surface 205 of integrated circuit 100. FIG. 4E, is a top view of substrate 105 and integrated circuit chip 100 with heat transfer layer 210A applied. Heat transfer layer 210A will become heat transfer layer 210 when heat sink 175 is brought into contact with integrated circuit chip 100 prior to the start of testing (see FIG. 1). The volume of heat transfer liquid dispensed may be adjusted by weir 270 (see FIG. 4A) such that during testing no heat transfer liquid spills over the edges of the integrated circuit chip being tested.

Returning to FIG. 4A, a person of ordinary skill in the art will be able to construct a jig for moveably holding stamp 275 that may placed first over platen 255 to pick up the heat transfer liquid and then placed over substrate 105 (see FIG. 1) to transfer the picked up heat transfer liquid to integrated circuit chip 100 (see FIG. 4E).

Figure 5A:
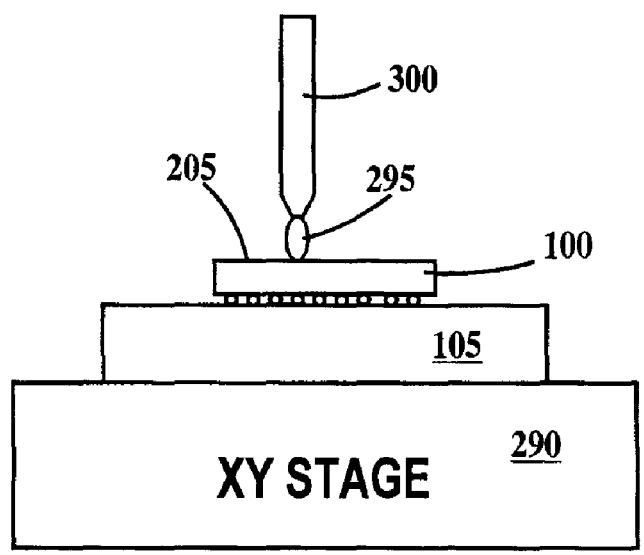
FIG. 5A-5D illustrate a second method and apparatus for applying a heat transfer material to an integrated circuit chip to be tested according to the present invention.
Figure 5B:
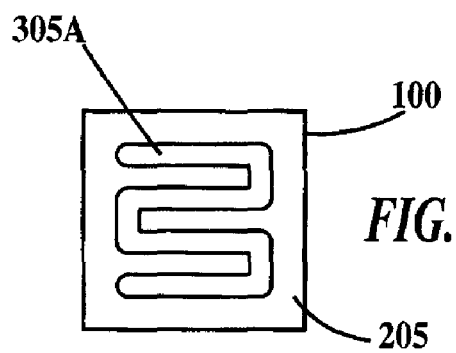
Figure 5C:
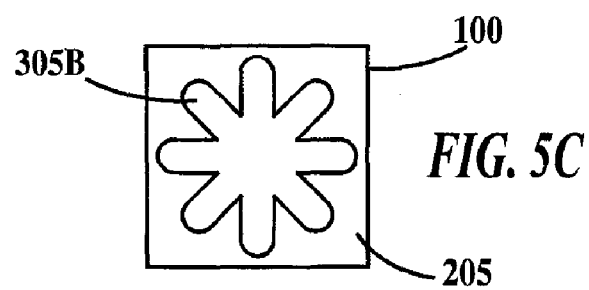
Figure 5D:
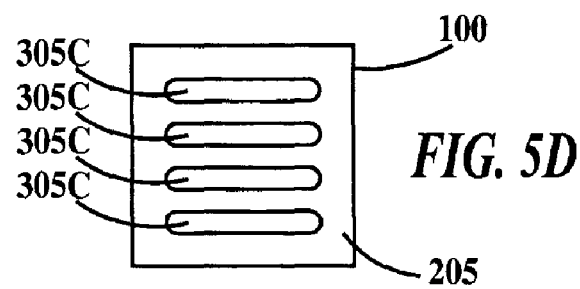

FIG. 5A-5D illustrate a second method and apparatus for applying a heat transfer material to an integrated circuit chip to be tested according to the present invention. In FIG. 5A, substrate 105 coupled to integrated circuit chip 100 is temporarily held on an X-Y stage 290, while a stream 295 of heat transfer liquid is dispensed on bottom surface 205 of the integrated circuit chip. The heat transfer liquid may be dispensed in any number of patterns, three examples of which are illustrated in FIGS. 5B, 5C and 5D.

In FIG. 5B, a heat transfer layer 305A has the form of a serpentine. Heat transfer layer 305B become heat transfer layer 210 (see FIG. 1) when heat sink 175 is brought into contact with integrated circuit chip 100 during testing and heat transfer layer 305B is spread out by the contact to form heat transfer layer 210. Again, the volume of heat transfer liquid dispensed may be adjusted such that during testing no heat transfer liquid spills over the edges of the integrated circuit chip being tested.

In FIG. 5C, a heat transfer layer 305A has the form of a star. Heat transfer layer 305B become heat transfer layer 210 (see FIG. 1) when heat sink 175 is brought into contact with integrated circuit chip 100 during testing and heat transfer layer 305B is spread out by the contact to form heat transfer layer 210.

In FIG. 5D, a heat transfer layer 305C is in the form of a series of parallel bars. Heat transfer layer 305C become heat transfer layer 210 (see FIG. 1) when heat sink 175 is brought into contact with integrated circuit chip 100 during testing and heat transfer layer 305C is spread out by the contact to form heat transfer layer 210.

Other methods of dispensing a heat transfer material onto the bottom surface of an integrated circuit chip include rolling, brushing and spraying. Heat transfer liquid may be include liquid, solid or gel materials dispersed or dissolved in a carrier liquid.

Figure 6:
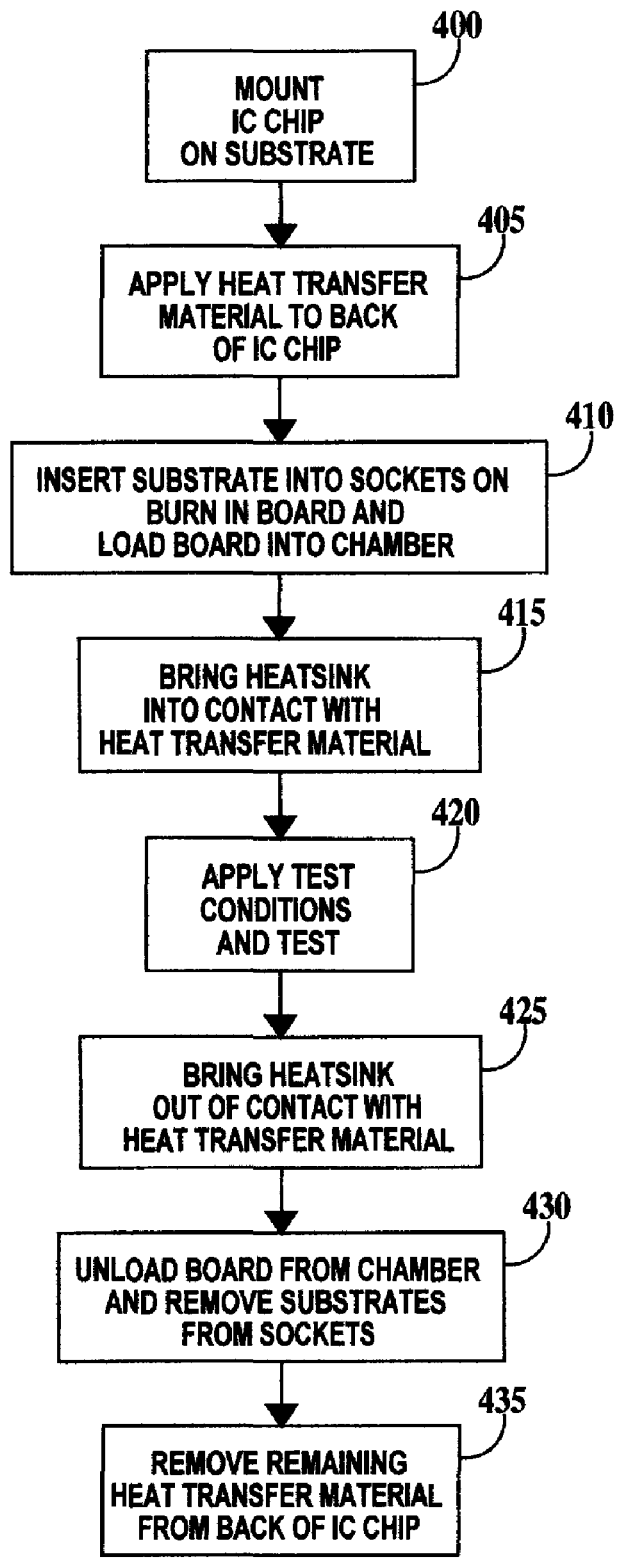
FIG. 6 is a flowchart of the method of testing an integrated circuit chip according to the present invention.

FIG. 6 is a flowchart of the method of testing an integrated circuit chip according to the present invention. In step 400, an integrated circuit chip is flip-chip mounted on a substrate. The substrate may be a permanent customer shippable module or a temporary test substrate. In step 405, a temporary layer of heat transfer material is applied to the bottom surface of the integrated circuit chip using any of the techniques described supra, or other techniques known in the art.

The heat transfer material should be a thermal conductor, an electrical insulator, have a flash point above about 20° C. above the burn-in or test temperature, have a low volatility (i.e. a vaporization or boiling temperature above about 20° C. above the burn-in or test temperature), be non-reactive with the ambient atmosphere, the integrated circuit chip or the heat sink, not degrade or decompose over the time the integrated circuit chip is at test temperature and be easily removed. The heat transfer material, in the case of a liquid, should have a viscosity high enough to allow controlled coating of the back surface of the integrated circuit chip without running over the edges of the integrated circuit chip but low enough to allow intimate contact of the integrated circuit chip and the heat sink over the range of spring force and burn-in temperatures expected.

In a first example, four classes of materials that may be used as heat transfer materials include synthetic inorganic oils, natural inorganic oils, synthetic organic oils and natural organic oils. In a second example, a particular class of oils that may be used as heat transfer materials are polyalpha-olefines (PAOs). In a third example, a particular PAO material that may be used as heat transfer material is hydrogenated 1-decence homopolymer available under the name of Synton PAO 40;100 manufactured by Daychem Labortories, Vandalia, Ohio. Synton PAO 40;100 was selected as a superior heat transfer material for the purposes of the present invention after exhaustive testing of many materials.

In step 410, the substrates are inserted into sockets on a burn-in board and the burn-in board is inserted into the burn-in chamber. In step 415, heat sinks in the burn-in chamber are brought into contact with the layer of heat transfer material on the individual integrated circuits in order to form heat transfer layer 210 (see FIG. 1). In step 420, burn-in test conditions (including raising the integrated circuit chip to burn-in temperature) are applied and the burn-in test performed as is well known in the art.

In step 425, the heat sinks are brought out of contact with the heat transfer material on individual integrated circuit chips. All or a portion of the heat transfer material remains on the back surface of the integrated circuit chips and a portion may remain on the heat sinks. In a first example, the heat transfer material is removed immediately or periodically from the heat sinks (e.g. by wiping with a clean dry cloth or solvent containing cloth) after testing just a single integrated circuit chip or after testing multiple integrated circuit chips. In a second example, the heat transfer material left on the heat sinks. In the second case it is helpful if the heat transfer material is chemically stable and non-volatile when exposed to burn-in temperatures for extended numbers of burn-in cycles.

In step 430, the burn-in boards are removed from the burn-in chamber and the substrates are removed from the burn-in boards.

In step 435, the heat transfer material is removed from the backside of the integrated circuit chips. In one example, wet cleaning is performed using one or more solvents that dissolve the heat transfer material. When the heat transfer material is a PAO, a suitable cleaning process includes one or more xylene spray cleaning followed by an isopropanol (IPA) spray cleaning, followed by a nitrogen spray dry. The method of the present invention is now complete.

Figure 7:
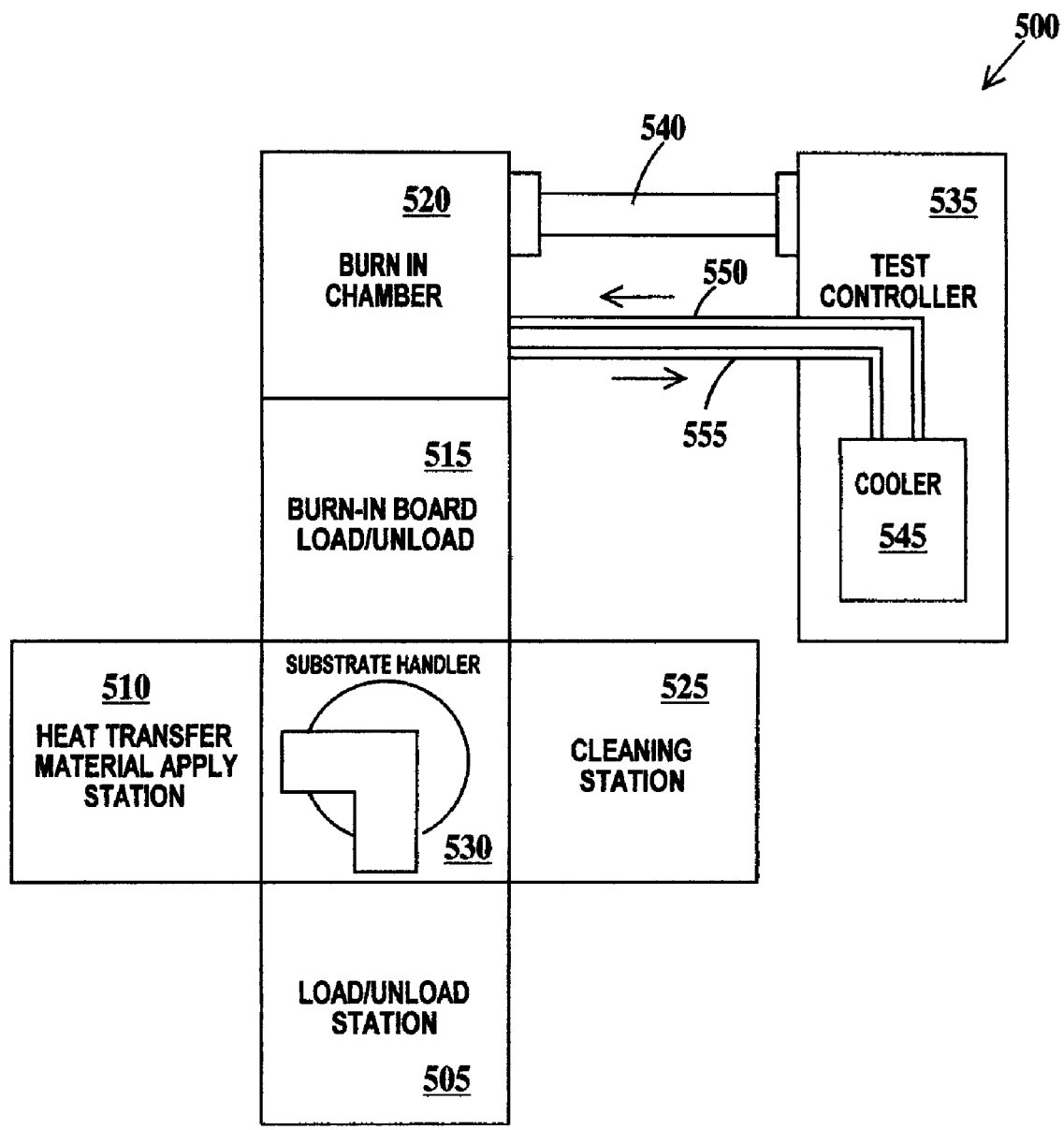
FIG. 7 is a top view schematic diagram of an automated tool for practicing the current invention.

FIG. 7 is a top view schematic diagram of an automated tool for practicing the current invention. In FIG. 7, a test system 500 includes a load/unload station 505 for loading and unloading substrates from/to substrate carriers, a heat transfer material apply station 510 for applying heat transfer material to the backside of integrated circuit chips by any of the techniques or other techniques described supra, a burn-in board load/unload station 515 for loading and unloading substrates from/to a burn-in board and loading and unloading burn-in boards from/to a burn-in chamber 520 in which testing is performed, a cleaning station 525 for removing heat transfer material from the back surface of integrated circuit chips, a substrate handler 530 for moving substrates between stations 505, 510, 515 and 525, and a test controller 535. Test controller 535 is connected to burn-in chamber 520 by a test signal/power cable 540. A cooling unit 545 within test or controller (or alternatively as a standalone unit) supplies cooling fluid to heats sinks within burn-in chamber 520 by inlet tube 550 and outlet tube 555. Test system 500 economically feasible only when the heat transfer fluid used within the system is stable for many burn-in test cycles and does not contaminate the system with heat transfer material decomposition products, thus requiring less test system maintenance.

Thus, the present invention provides an efficient method and apparatus for thermally coupling an integrated circuit chip under test to a heat sink.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of testing, comprising:
    (a) electrically connecting chip pads on top surfaces of each integrated circuit chip of a multiplicity of integrated circuit chips to module pads on top surfaces of respective modules of a multiplicity of modules;
    after step (a), (b) dispensing a predetermined volume of polyalphaolefine oil on bottom surfaces of each integrated circuit chip of said multiplicity of integrated circuit chips;
    after step (b), (c) electrically connecting socket pads on bottom surfaces of each module of said multiplicity of modules to a respective socket electrically connected to a circuit board;
    after step (c), (d) placing said circuit board into an oven at a temperature above room temperature;
    after step (d), (e) pressing front surfaces of a multiplicity of heat sinks to bottom surfaces of respective integrated circuit chips of said multiplicity of integrated circuit chips, said pressing causing said volume of polyalphaolefine oil to form a heat transfer layer between bottom surfaces of said multiplicity of integrated circuit chip and front surfaces of said multiplicity of heat sinks, said multiplicity of heat sinks mounted to a rack in said oven;
    after step (e), (f) electrically testing said chips at a test temperature above room temperature, said liquid heat transfer layer being non-volatile and thermally stable at said test temperature;
    after step (f), (g) removing said heat sinks from contact with said heat transfer layer;
    after step (g), (h) removing said circuit board from said oven;
    after step (h), (i) removing said multiplicity of modules from said multiplicity of sockets; and
    after step (i), (h) removing any heat transfer layer remaining on said multiplicity of integrated circuits.

2. The method of claim 1, wherein said chip pads include signal and power pads.

3. The method of claim 1, wherein step (d) includes connecting said circuit board to a tester.

4. The method of claim 1, wherein said test temperature is about 80° C. or higher.

5. The method of claim 1, wherein said test temperature is about 140° C. or higher.

6. The method of claim 1, wherein said polyalphaolefine oil comprises hydrogenated 1-decence homopolymer.

7. The method of claim 1, further including:
    individually controlling the circulation of a fluid through each heat sink of said multiplicity of heat sinks in order to control a temperature of respective integrated circuits of said multiplicity of integrated circuits.

8. The method of claim 1, wherein step (i) includes rinsing said electronic device in an organic solvent.

9. The method of claim 1, wherein, after step (f), a portion of said heat transfer layer remains on said heat sink.

10. The method of claim 1, further including:
    after step (i), repeating steps (a) through (i) with an additional multiplicity integrated circuit chips.

11. The method of claim 10, wherein
    a volume of said polyalphaolefine oil dispensed in step (b) for each additional integrated circuit chip of said additional multiplicity of integrated circuit chips is an additional predetermined volume less than said predetermined volume.

12. The method of claim 1, further including:
    after step (i), removing any heat transfer layer remaining on said top surface of each heat sink of said multiplicity of heat sinks.

13. The method of claim 1, wherein step (b) includes:
    dispensing said polyalphaolefine oil in a serpentine pattern, a star patter or a set of parallel bars on order that said heat transfer layer in order to prevent spillage of said polyalphaolefine oil onto said multiplicity of modules and multiplicity of sockets.

14. The method of claim 1, wherein said polyalphaolefine oil has a vaporization temperature about 20° C. above said test temperature.

15. The method of claim 1, wherein said heat transfer layer has a thickness between about 0 microns and about 3 microns and said heat transfer layer completely fills a gap between said top surfaces of each heat sink of said multiplicity of heat sink and said top surfaces of each integrated circuit chip of said multiplicity of integrated circuit chips.

16. The method of claim 1, wherein in step (e) no portion of said polyalphaolefine oil spills over sides of any heat sink of said multiplicity of heat sink or sides of any module of said multiplicity of modules.

17. The method of claim 1 wherein said polyalphaolefine oil is electrically non-conductive.

* * * * *